(12) United States Patent
Yang

(10) Patent No.: US 9,754,640 B1
(45) Date of Patent: Sep. 5, 2017

(54) SENSING CIRCUIT AND METHOD UTILIZING VOLTAGE REPLICATION FOR NON-VOLATILE MEMORY DEVICE

(71) Applicant: MACRONIX INTERNATIONAL CO., LTD., Hsinchu (TW)

(72) Inventor: Shang-Chi Yang, Changhua County (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/297,199

(22) Filed: Oct. 19, 2016

(51) Int. Cl.
    *G11C 7/06* (2006.01)
    *G11C 7/12* (2006.01)
    *G11C 7/14* (2006.01)

(52) U.S. Cl.
    CPC .............. *G11C 7/062* (2013.01); *G11C 7/12* (2013.01); *G11C 7/14* (2013.01)

(58) Field of Classification Search
    CPC ............. G11C 7/062; G11C 7/12; G11C 7/14
    USPC .................................................. 365/189.07
    See application file for complete search history.

(56) References Cited

U.S. PATENT DOCUMENTS

| | | | |
|---|---|---|---|
| 6,445,616 B2* | 9/2002 | Kim | ................... G11C 11/5621 365/185.2 |
| 7,751,251 B2 | 7/2010 | Bauer | |
| 7,969,804 B1 | 6/2011 | Hirose et al. | |
| 2012/0182818 A1 | 7/2012 | Huang et al. | |
| 2012/0320691 A1 | 12/2012 | Dally et al. | |
| 2015/0170730 A1 | 6/2015 | Antonyan | |

* cited by examiner

*Primary Examiner* — Tha-O H Bui
(74) *Attorney, Agent, or Firm* — McClure, Qualey & Rodack, LLP

(57) ABSTRACT

A sensing circuit for a non-volatile memory device is provided. The sensing circuit includes a bias generating circuit and a first sense amplifier. The bias generating circuit includes a driving circuit biased by a reference current and an operational amplifier. The operation amplifier receives a reference voltage at a non-inverting input terminal, and generates an output voltage at an inverting input terminal via a negative feedback path including the driving circuit. The first sense amplifier includes a first replica circuit and a first current sensing circuit. The first replica circuit replicates the output voltage to a first bit line coupled to a first memory cell. The first current sensing circuit senses a first current difference between a scaled version of the reference current and a first cell current of the first memory cell to determine a first memory state of the first memory cell.

20 Claims, 6 Drawing Sheets

SENSING CIRCUIT AND METHOD UTILIZING VOLTAGE REPLICATION FOR NON-VOLATILE MEMORY DEVICE

TECHNICAL FIELD

The disclosure relates to non-volatile memory, and more particularly, to a sensing circuit and a sensing method for a non-volatile memory device.

BACKGROUND

Non-volatile memory devices retain stored data even when disconnected from power. Examples of non-volatile memory devices include NAND flash memory, NOR flash memory, phase change memory (PCM), and resistive random-access memory (RRAM). Different data stored in the non-volatile memory may correspond to different threshold voltage (Vt) or different resistance of the memory cell. The memory state may thus be detected by sensing the current flowing through the memory cell. As the number of memory cells in a memory chip increases, there is a need for a cost-effective and reliable sensing circuit and sensing method for a non-volatile memory device.

SUMMARY

The disclosure relates to a sensing circuit and method for a non-volatile memory device.

According to one embodiment, a sensing circuit for a non-volatile memory device is provided. The sensing circuit includes a bias generating circuit and a first sense amplifier. The bias generating circuit includes a driving circuit and an operational amplifier. The driving circuit is biased by a reference current. The operation amplifier receives a reference voltage at a non-inverting input terminal of the operational amplifier, and generates an output voltage at an inverting input terminal of the operational amplifier via a negative feedback path including the driving circuit. The first sense amplifier includes a first replica circuit and a first current sensing circuit. The first replica circuit is coupled to the bias generating circuit, and replicates the output voltage to a first bit line coupled to a first memory cell. The first current sensing circuit is coupled to the first replica circuit, and senses a first current difference between a scaled version of the reference current and a first cell current of the first memory cell to determine a first memory state of the first memory cell.

According to one embodiment, a sensing method for a non-volatile memory device is provided. The sensing method includes the following steps. Biasing a driving circuit by a reference current. Receiving a reference voltage at a non-inverting input terminal of an operational amplifier. Generating an output voltage at an inverting input terminal of the operational amplifier via a negative feedback path including the driving circuit. Replicating the output voltage to a first bit line coupled to a first memory cell. Sensing a first current difference between a scaled version of the reference current and a first cell current of the first memory cell to determine a first memory state of the first memory cell.

Figure 1:
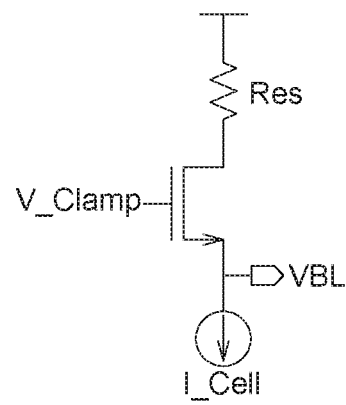
FIG. 1 shows a diagram illustrating an example clamped sensing circuit for a non-volatile memory device.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

FIG. 1 shows a diagram illustrating an example clamped sensing circuit for a non-volatile memory device. The current I_cell in this figure represents the current flowing through the memory cell. A bit line voltage VBL is provided to the bit line, and then the state of a target memory cell may be detected by sensing voltage or current on the particular bit line. However there may be some problems encountered in this sensing circuit. For example, when this sensing circuit is used in RRAM, the bit line voltage VBL becomes dependent on the cell current I_Cell. For a low resistive cell, a larger cell current lowers the bit line voltage VBL as compared to a high resistive cell. Such unstable bit line voltage may cause read window loss, resulting in data read failure. In addition, if the bit line voltage VBL overcharges for some reason, such as being perturbed or interfered, the only discharge path is via the cell current I_Cell. The discharge speed is slow due to the small cell current I_Cell, which is nA order. Besides, in a memory array structure, the memory cell being sensed may be far away from the sensing circuit, which even degrades the discharge speed. As another example, when this sensing circuit is used in a NOR flash memory, the soft program effect may become even more severe. Specifically, the NOR flash memory is slightly programmed during the read operation. For reading a low Vt cell, the cell is also slightly programmed such that the threshold voltage increases. Such increase in Vt lowers the cell current I_Cell, which in turn increases the bit line voltage VBL, and the larger VBL strengthens the program operation such that the threshold voltage is raised more. This causes a positive feedback soft program effect that makes a low Vt cell become a high Vt cell during the read operation.

Due to the problems addressed above, providing a stable bit line voltage VBL is necessary in sensing a non-volatile memory device.

Figure 2:
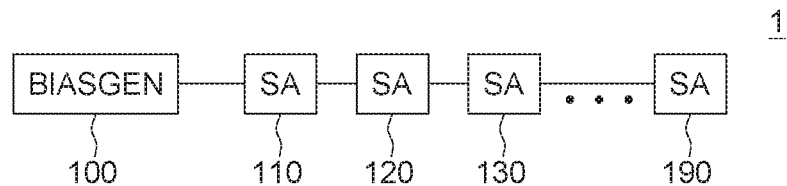
FIG. 2 shows a block diagram illustrating architecture of a sensing circuit according to an embodiment of the disclosure.

FIG. 2 shows a block diagram illustrating architecture of a sensing circuit according to an embodiment of the disclosure. The sensing circuit 1 includes a bias generating circuit 100 and multiple sense amplifiers 110, 120, 130, ..., 190. Each of the sense amplifiers 110-190 may be coupled to one of the bit lines in the memory array structure to read data from a memory cell at that particular bit line. The bias generating circuit 100 may provide at least one bias voltage to all the sense amplifiers 110-190. In the sensing circuit 1, because all the sensing amplifiers 110-190 share the common bias generating circuit 100, the hardware area required for bias generation may be saved.

Figure 3:
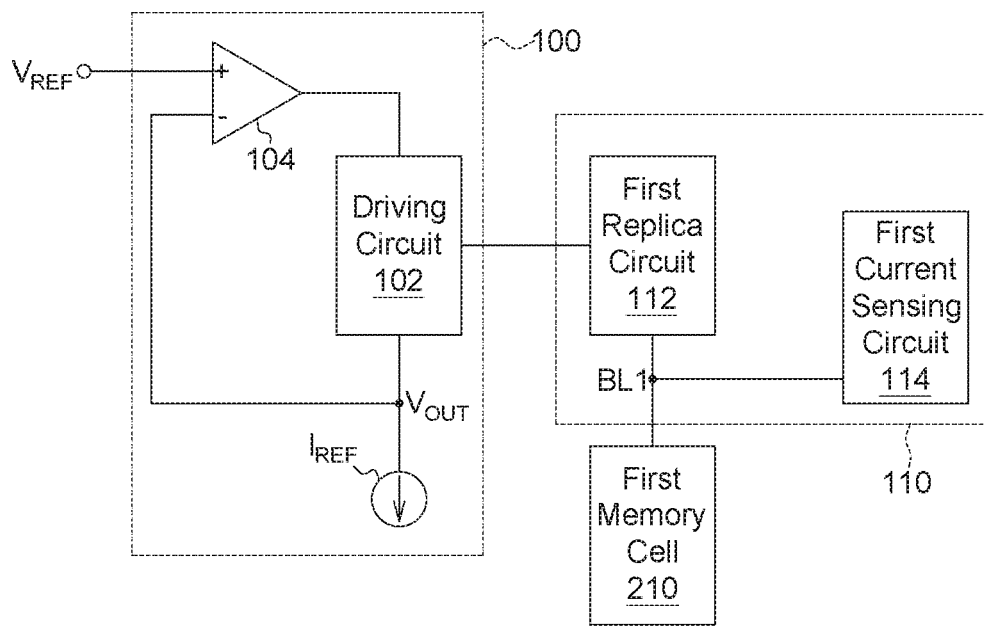
FIG. 3 shows a diagram illustrating a sensing circuit according to an embodiment of the disclosure.

FIG. 3 shows a diagram illustrating a sensing circuit according to an embodiment of the disclosure. A single sense amplifier is shown in FIG. 3 to simplify the drawing and to show that a single sense amplifier is also feasible for the proposed sensing circuit. In this embodiment, the sensing circuit 1 includes a bias generating circuit 100 and a first sense amplifier 110. The bias generating circuit 100 includes a driving circuit 102 and an operational amplifier 104. The driving circuit 102 is biased by a reference current $I_{REF}$. The operation amplifier 104 receives a reference voltage $V_{REF}$ at a non-inverting input terminal of the operational amplifier 104, and generates an output voltage $V_{OUT}$ at an inverting input terminal of the operational amplifier 104 via a negative feedback path including the driving circuit 102. The first sense amplifier 110 includes a first replica circuit 112 and a first current sensing circuit 114. The first replica circuit 112 is coupled to the bias generating circuit 102, and replicates the output voltage $V_{OUT}$ to a first bit line BL1 coupled to a first memory cell 210. The first current sensing circuit 114 is coupled to the first replica circuit 112, and senses a first current difference between a scaled version of the reference current $I_{REF}$ and a first cell current of the first memory cell 210 to determine a first memory state of the first memory cell 210.

Figure 8:
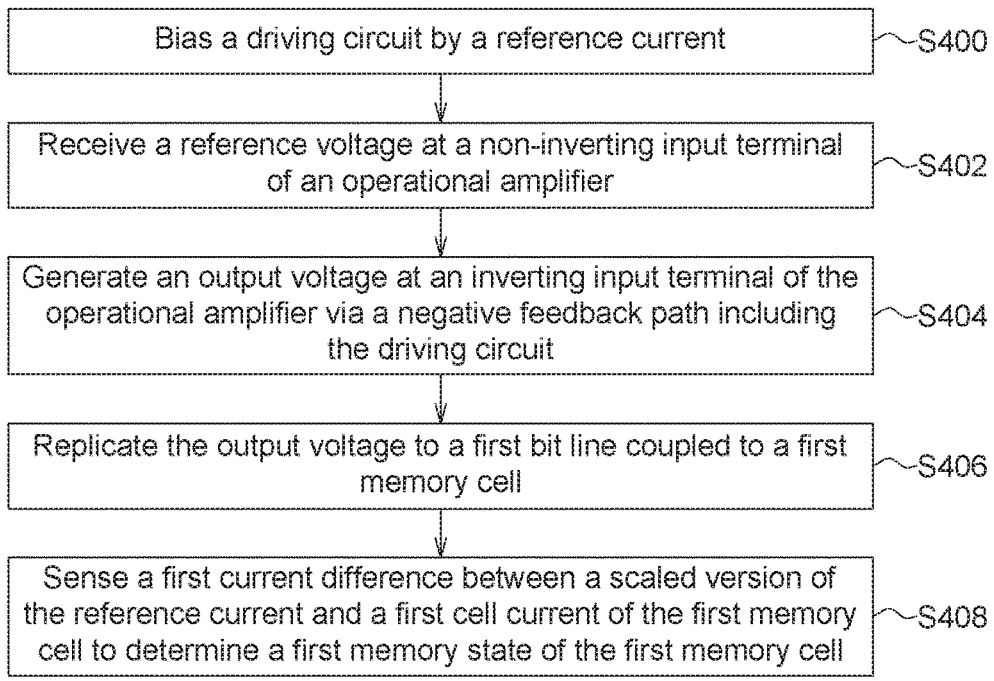
FIG. 8 shows a flowchart of a sensing method for a non-volatile memory device according to one embodiment of the invention.

The sensing method adopted in the sensing circuit shown in FIG. 3 may be referred to FIG. 8, which shows a flowchart of a sensing method for a non-volatile memory device according to one embodiment of the invention. The sensing method includes the following steps. Step S400: Bias a driving circuit by a reference current. Step S402: Receive a reference voltage at a non-inverting input terminal of an operational amplifier. Step S404: Generate an output voltage at an inverting input terminal of the operational amplifier via a negative feedback path including the driving circuit. Step S406: Replicate the output voltage to a first bit line coupled to a first memory cell. Step S408: Sense a first current difference between a scaled version of the reference current and a first cell current of the first memory cell to determine a first memory state of the first memory cell.

In the bias generating circuit 100, the operation amplifier 104 receives a reference voltage $V_{REF}$, which may be provided by a bandgap voltage reference circuit capable of producing constant voltage regardless of power supply variations, temperature changes and circuit loadings. The driving circuit 102 and the operational amplifier 104 constitute a negative feedback loop, such that the output voltage $V_{OUT}$ at the inverting input terminal of the operational amplifier 104 is substantially equal to the reference voltage $V_{REF}$ because of the input virtual short characteristic of the operational amplifier 104. The first replica circuit 112 replicates the output voltage $V_{OUT}$ to the first bit line BL1. Therefore a stable bit line voltage is successfully provided to the bit line for reading a memory cell.

In order to read the content stored in the first memory cell 210, the first cell current of the first memory cell 210 is sensed. The sensed first cell current is then compared with a scaled version of the reference current $I_{REF}$. The first current sensing circuit 114 senses a first current difference between the scaled version of the reference current $I_{REF}$ and the first cell current. The reference current $I_{REF}$ may be appropriately scaled such that the first current difference is a clear indication of the first memory state of the first memory cell 210. For example, the reference current $I_{REF}$ may be scaled by ½, ⅔, ¾, or other scaling factors depending on the circuit implementation. In one embodiment, the first current difference may be obtained by subtracting the first cell current from the scaled version of the reference current $I_{REF}$. When the first current difference is greater than 0, the first memory cell 210 is determined as a high Vt cell. When the first current difference is less than 0, the first memory cell 210 is determined as a low Vt cell. This is merely an example of scaling and comparison, the claimed subject matter is not limited in this regard.

Figure 4:
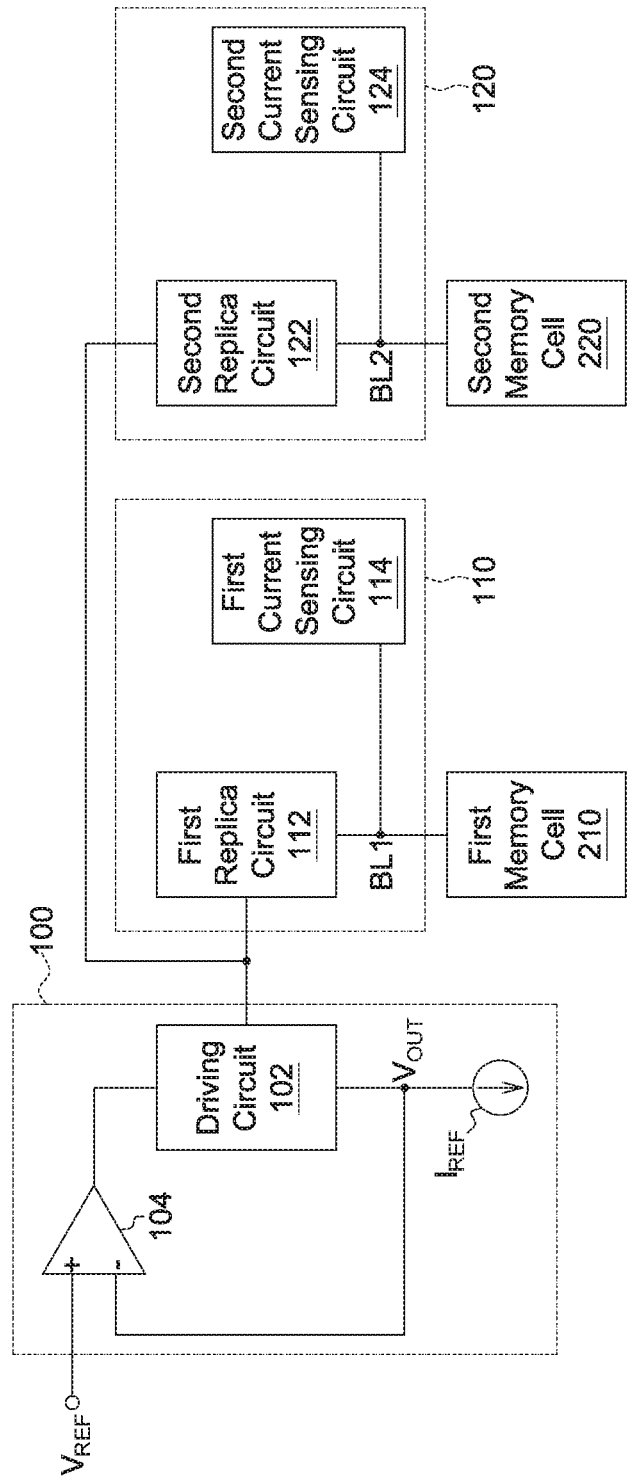
FIG. 4 shows a diagram illustrating a sensing circuit according to an embodiment of the disclosure.

As shown in FIG. 2, there may be more than one sense amplifier in the sensing circuit 1. FIG. 4 shows a diagram illustrating a sensing circuit which includes two sense amplifiers according to an embodiment of the disclosure. The sensing circuit in FIG. 4 includes the bias generating circuit 100, the first sense amplifier 110, and the second sense amplifier 120. The second sense amplifier 120 may be structurally equivalent to the first sense amplifier 110. The second sense amplifier 120 includes a second replica circuit 122 and a second current sensing circuit 124. The second replica circuit 122 is coupled to the bias generating circuit 100, for replicating the output voltage $V_{OUT}$ to a second bit line BL2 coupled to a second memory cell 220. The second current sensing circuit 124 is coupled to the second replica circuit 122, for sensing a second current difference between a scaled version of the reference current $I_{REF}$ and a second cell current of the second memory cell 220 to determine a second memory state of the second memory cell 220.

The second memory cell 220 may be coupled to the first memory cell 210 via a word line and adjacent to the first memory cell 210. In other words, the second bit line BL2 may be adjacent to the first bit line BL1 in the memory array structure. The first sense amplifier 110 and the second sense amplifier 120 share the same bias generating circuit 100, and therefore the hardware cost can be saved. For example, in a memory device with hundreds or thousands of bit lines, a corresponding number of sense amplifiers are needed, but still only one bias generating circuit is required in the proposed sensing circuit. In one embodiment, the bias generating circuit 100 provides at least one bias voltage to the first sense amplifier 110 and the second sense amplifier 120 such that a stable bit line voltage can be applied to both the first bit line BL1 and the second bit line BL2. The operation of the second sense amplifier 120 is similar to that of the first amplifier 110 and thus is not repeated here.

Figure 9:
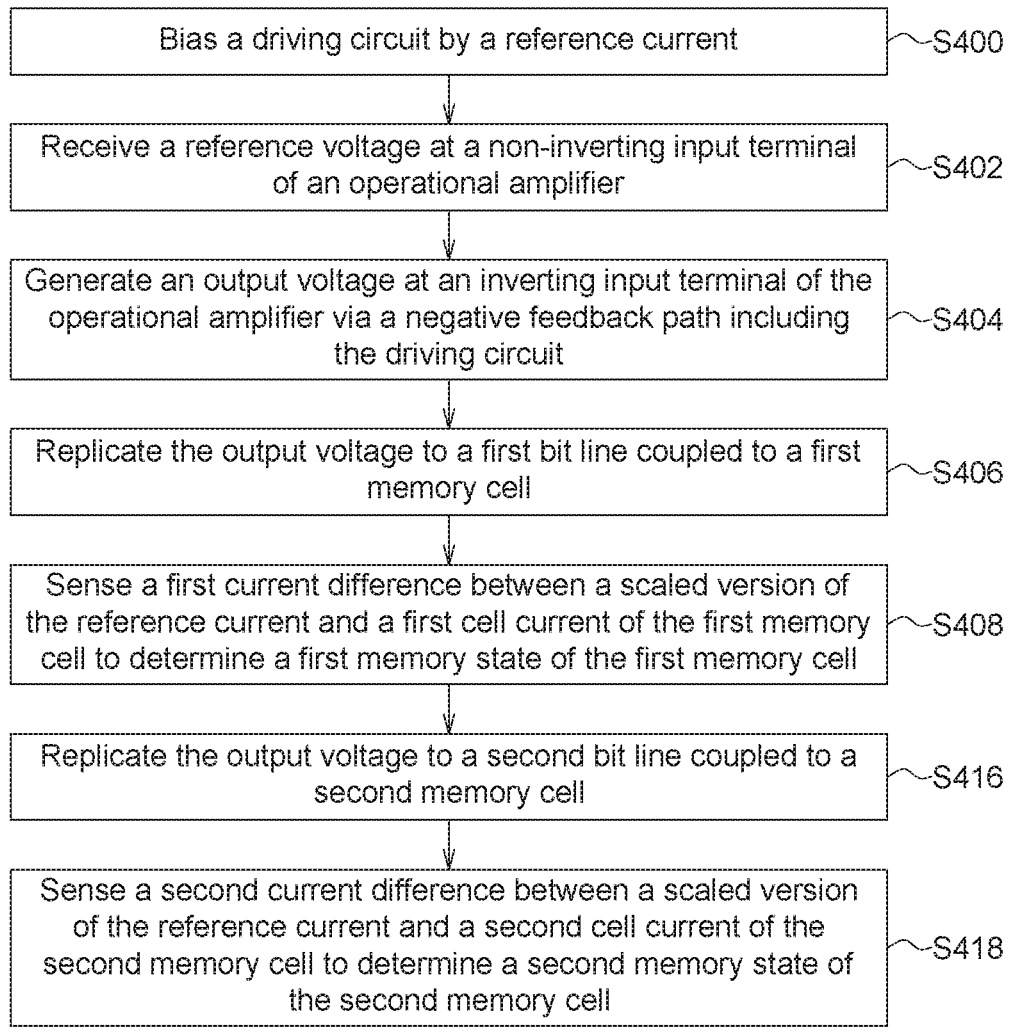
FIG. 9 shows a flowchart of a sensing method for a non-volatile memory device according to one embodiment of the invention.

The sensing method adopted in the sensing circuit shown in FIG. 4 may be referred to FIG. 9, which shows a flowchart of a sensing method for a non-volatile memory device according to one embodiment of the invention. As compared to the flowchart shown in FIG. 8, the method in FIG. 9 further includes steps S416 and S418. Step S416: Replicate the output voltage to a second bit line coupled to a second memory cell. Step S418: Sense a second current difference between a scaled version of the reference current and a second cell current of the second memory cell to determine a second memory state of the second memory cell. The step S416 may be performed by the second replica circuit 122, and the step S418 may be performed by the second current sensing circuit 124.

There may be several different circuit realizations for the first replica circuit 112. In one embodiment, the first replica circuit 112 includes a first current mirror which is configured to mirror the reference current $I_{REF}$. The first current mirror may produce the same current as the reference current $I_{REF}$ such that the voltage generated by the first replica circuit 112 may be equal to the output voltage $V_{OUT}$. The first current mirror may be implemented by bipolar transistors or MOSFET transistors. The current mirror approach may be applied to the second replica circuit 122 as well.

Figure 5:
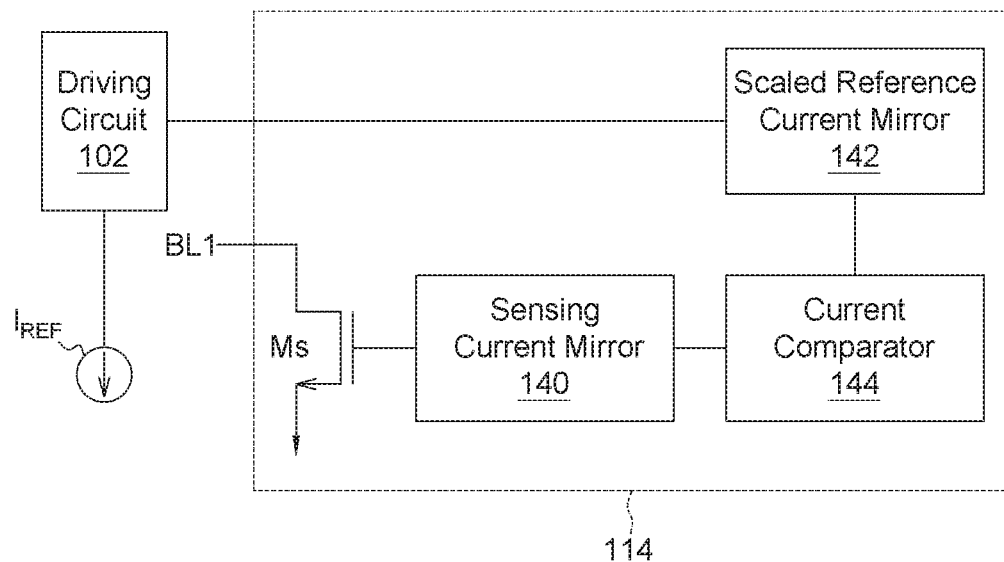
FIG. 5 shows a diagram illustrating the first current sensing circuit according to an embodiment of the disclosure.

The first current sensing circuit 114 may also be realized by various circuit structures. FIG. 5 shows a diagram illustrating the first current sensing circuit according to an embodiment of the disclosure. The first current sensing circuit 114 includes a sensing transistor Ms, a sensing current mirror 140, a scaled reference current mirror 142, and a current comparator 144. The sensing transistor Ms is configured to detect the first cell current. The sensing transistor Ms may be coupled to the first bit line BL1 and may be implemented by for example an NMOS transistor. In FIG. 5 the sensing transistor Ms is depicted as an NMOS transistor. However, the sensing transistor Ms may also be a PMOS transistor in implementation. The sensing current mirror 140 is configured to mirror a current flowing through the sensing transistor Ms. The scaled reference current mirror 142 is configured to mirror the scaled version of the reference current $I_{REF}$. The current comparator 144 is configured to compare a current of the sensing current mirror 140 and a current of the scaled reference current mirror 142 to determine the first memory state of the first memory cell 210.

As described above, the reference current $I_{REF}$ may be appropriately scaled to facilitate sensing operation. In one embodiment, the scaling factor may be controlled by transistor sizing. According to the circuit structure shown in FIG. 5, the sensing current mirror 140 obtains current information of the first memory cell 210, the scaled reference current mirror 142 obtains the scaled reference current, and the current comparator 144 may determine the memory state by comparing these two currents. For example, the current comparator 144 may include an output latch and/or a load capacitor, when the scaled reference current is greater than the cell current, the load capacitor may be charged such that a logic high level is outputted, representing a high Vt cell. On the other hand, when the scaled reference current is less than the cell current, the load capacitor may be discharged such that a logic low level is outputted, representing a low Vt cell. This is merely a design example rather than limiting the invention. Different circuit implementations of the current comparator 144 may also be applicable (for example, in one embodiment, the output logic high level of the current comparator may represent a low Vt cell). Also note that the block diagram shown in FIG. 5 is functional block representation to clearly illustrate the operation of the first current sensing circuit 114. Different blocks shown in FIG. 5 may share common circuit elements in the actual circuit realization.

Figure 10:
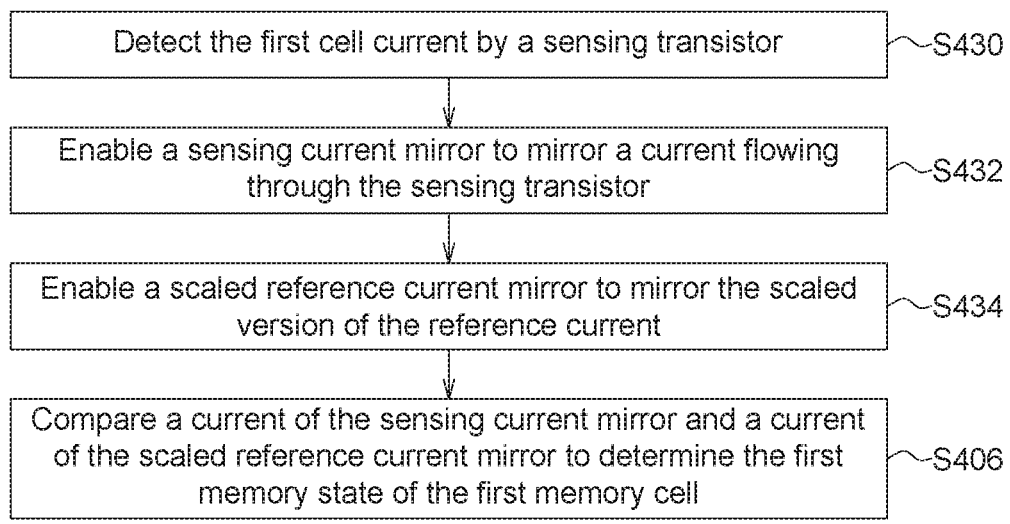
FIG. 10 shows a flowchart of the step of sensing the first current difference between the scaled version of the reference current and the first cell current of the first memory cell according to one embodiment of the invention.

The method adopted in the first current sensing circuit 114 may be referred to FIG. 10, which shows a flowchart of the step of sensing the first current difference between the scaled version of the reference current and the first cell current of the first memory cell according to one embodiment of the invention. The method includes the following steps. Step S430: Detect the first cell current by a sensing transistor. Step S432: Enable a sensing current mirror to mirror a current flowing through the sensing transistor. Step S434: Enable a scaled reference current mirror to mirror the scaled version of the reference current. The scaling factor here may be for example ½, ⅔, ¾. Step S436: Compare a current of the sensing current mirror and a current of the scaled reference current mirror to determine the first memory state of the first memory cell.

Figure 6:
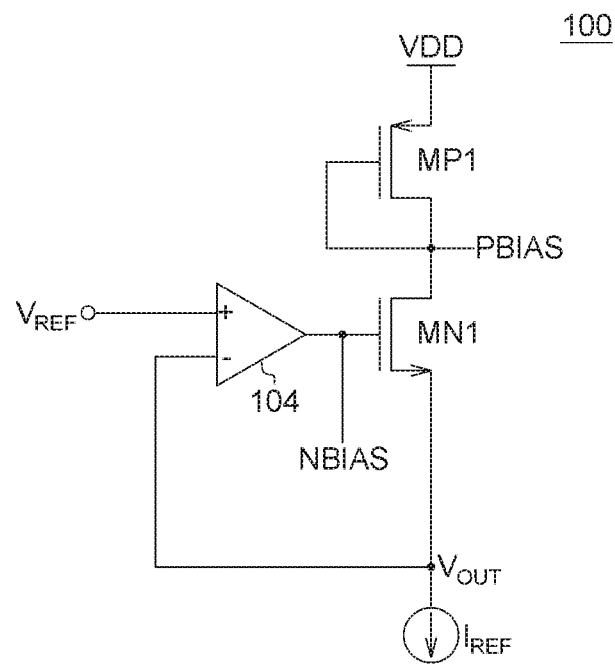
FIG. 6 shows a diagram illustrating the bias generating circuit according to an embodiment of the disclosure.

An embodiment of the transistor level implementation is given below. In this embodiment MOSFET transistors are used as an example. FIG. 6 shows a diagram illustrating the bias generating circuit according to an embodiment of the disclosure. The driving circuit 102 includes a first PMOS transistor MP1 and a first NMOS transistor MN1. The first PMOS transistor MP1 has a source, a drain coupled to the supply voltage VDD, and a gate coupled to the drain to provide a first bias voltage PBIAS. The first NMOS transistor MN1 has a source coupled to the inverting input terminal of the operational amplifier 104, a drain coupled to the drain of the first PMOS transistor MP1, and a gate coupled to an output terminal of the operational amplifier 104 to provide a second bias voltage NBIAS. In this embodiment, the bias generating circuit 100 provides two bias voltages, including PBIAS and NBIAS, to the first sense amplifier 110 (and also to the second sense amplifier 120). The first PMOS transistor MP1 and the first NMOS transistor MN1 are biased by the reference current $I_{REF}$.

Figure 7:
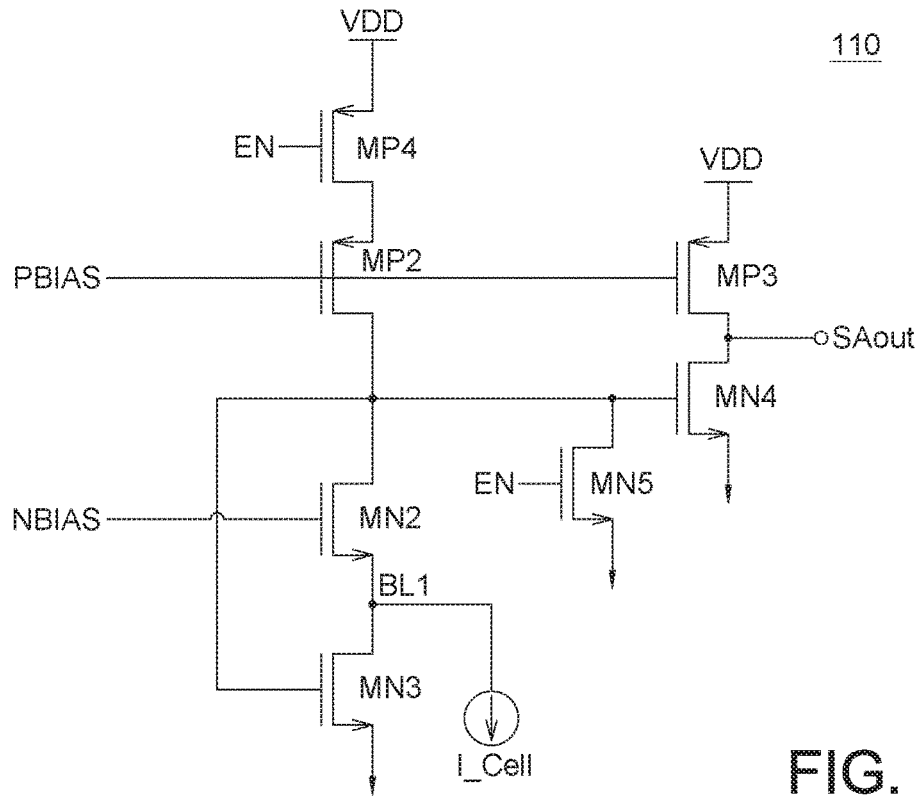
FIG. 7 shows a diagram illustrating the first sense amplifier according to an embodiment of the disclosure.

FIG. 7 shows a diagram illustrating the first sense amplifier according to an embodiment of the disclosure. The first replica circuit 112 includes a second PMOS transistor MP2 and a second NMOS transistor MN2. The second PMOS transistor MP2 has a source, a drain, and a gate coupled to the first bias voltage PBIAS. The second NMOS transistor MN2 has a source coupled to the first bit line BL1, a drain coupled to the drain of the second PMOS transistor MP2, and a gate coupled to the second bias voltage NBIAS.

In one embodiment, the first PMOS transistor MP1 and the second PMOS transistor MP2 may form a matched pair. In addition, the first NMOS transistor and the second NMOS transistor may also form a matched pair. A current mirror is thus created. In one embodiment, the first PMOS transistor MP1 and the second PMOS transistor MP2 are equal in size, and the first NMOS transistor MN1 and the second NMOS transistor MN2 are equal in size. Therefore the current flowing through the second PMOS transistor MP2 and the second NMOS transistor MN2 is substantially equal to the reference current $I_{REF}$. Given the same biasing condition between the driving circuit 102 and the first replica circuit 112, the bit line voltage at the source terminal of the second NMOS transistor MN2 is substantially equal to the output voltage $V_{OUT}$. A constant bit line voltage is thus successfully provided to the first bit line BL1.

The first current sensing circuit 114 includes a third NMOS transistor MN3, a third PMOS transistor MP3, and a fourth NMOS transistor MN4. The third NMOS transistor MN3 has a source, a drain coupled to the first bit line BL1, and a gate coupled to the drain of the second NMOS transistor MN2. The third PMOS transistor MP3 has a source, a drain, and a gate coupled to the first bias voltage PBIAS. The fourth NMOS transistor MN4 has a source, a drain coupled to the drain of the third PMOS transistor MP3, and a gate coupled to the gate of the third NMOS transistor MN3.

As shown in FIG. 7, the current flowing through the third NMOS transistor MN3 is the difference between the reference current $I_{REF}$ and the cell current I_Cell of the first memory cell 210 ($I_{MN3}=I_{REF}-I\_Cell$). That is, the third NMOS transistor MN3 effectively senses the cell current of the first memory cell 210 (referring to the sensing transistor Ms in FIG. 5). In one embodiment, the third NMOS transistor MN3 and the fourth NMOS transistor MN4 are equal in size, creating a current mirror structure. The current flowing through the fourth NMOS transistor MN4 is substantially equal to the current flowing through the third NMOS transistor MN3 ($I_{MN4}=I_{MN3}=I_{REF}-I\_Cell$). The third NMOS transistor MN3 and the fourth NMOS transistor MN4 may constitute the sensing current mirror 140 shown in FIG. 5.

The first PMOS transistor MP1 and the third PMOS transistor MP3 also form a current mirror (referring to the scaled reference current mirror 142 in FIG. 5). The ratio k of the size of the third PMOS transistor MP3 to the size of the first PMOS transistor MP1 may be appropriately set to mirror a scaled version ($k\times I_{REF}$) of the reference current $I_{REF}$. The output node SAout shown in FIG. 7 may be coupled to a load capacitor and/or a latch to produce the sensing result. Note that the current flowing out from the output node SAout is equal to the first current difference ($I_{MP3}-I_{MN4}$)=$k\times I_{REF}-(I_{REF}-I\_Cell)=I\_Cell-(1-k)\times I_{REF}$. The third PMOS transistor MP3 and the fourth NMOS transistor MN4 constitute a current comparator that compares the scaled reference current and the cell current (referring to the current comparator 144 shown in FIG. 5).

In order to make the sense amplifier circuit simple and to make the first current difference a clear indication of the first memory state of the first memory cell 210, the first current difference may be set to have different polarities depending on the first memory state of the first memory cell 210. As such, the value $(1-k)\times I_{REF}$ may be set to be equal to a current of a reference memory cell. A reference memory cell is a special type memory cell that has a threshold voltage between high Vt and low Vt such that the current of the reference memory cell provides a threshold for determining the state of a general memory cell according to the sensed cell current. The cell current of the reference memory cell is represented as Ir is the following description.

By setting the value $(1-k)\times I_{REF}$ equal to Ir, the first current difference ($I_{MP3}-I_{MN4}$)=(I_Cell-Ir), which has different polarities according to the memory state and thus the cell content can be easily extracted. There are many possible design options satisfying the equation $(1-k)\times I_{REF}$=Ir. In one embodiment, the reference current $I_{REF}$ is two times of a current of a reference memory cell Ir ($I_{REF}=2\times Ir$), and the size of the first PMOS transistor MP1 is two times of the size of the third PMOS transistor MP3 (scaling factor k=½). Other parameter setting may also be feasible, for example, $I_{REF}=3\times Ir$, k=⅔, and so on. The reference current $I_{REF}$ as shown in FIG. 3 may be implemented as a current mirror that mirrors a scaled version (for example, two times) of the current of the reference memory cell Ir.

Also note that the first bit line BL1 shown in FIG. 7 may be discharged via not only the cell current I_Cell but also the third NMOS transistor MN3. If the bit line voltage overcharges for some reason, the discharge speed is enhanced (by providing an additional discharge path) as compared to discharging via only the memory cell. Therefore the disclosed circuit structure overcomes the bit line overcharge problem as well.

The first sense amplifier 110 shown in FIG. 7 may further optionally include a timing control circuit. For example, the first sense amplifier 110 may further include a fourth PMOS transistor MP4 and a fifth NMOS transistor MN5. The fourth PMOS transistor MP4 has a source coupled to the supply voltage VDD, a drain coupled to the source of the second PMOS transistor MP2, and a gate coupled to an enable signal EN. The fifth NMOS transistor MN5 has a source, a drain coupled to the gate of the fourth NMOS transistor MN4, and a gate coupled to the enable signal EN. The operation timing of the first sense amplifier 110 may be controlled by controlling the enable signal EN. In one embodiment, the first sense amplifier 110 may be configured to enable or disable the current sensing operation in response to the enable signal EN. When the enable signal EN is low logic level (for example, 0V), the first sense amplifier 110 performs the current sensing operation as described above. When the enable signal EN is high logic level (for example, VDD), the first sense amplifier 110 disables the current sensing operation.

The transistor level implementations shown in FIG. 6 and FIG. 7 are just exemplary rather than limiting the invention. Various circuit modifications may be made to the embodiments shown in FIG. 6 and FIG. 7. For example, a single MOS transistor may be replaced by cascoded MOS structure to enhance circuit performance, current mirror may be implemented by different well known current mirror architecture, and different transistor sizing strategies may also be adopted.

According to the proposed sensing circuit and sensing method in this disclosure, a constant bit line voltage can be provided to each bit line such that reliable memory read operation can be achieved. The bias generating circuit for providing the bias voltage is shared by each sense amplifier, and therefore there is no operation amplifier needed in the sense amplifier circuit. This reduces not only the circuit hardware area but also the circuit power consumption. In addition, by appropriately setting the scaling factor and the magnitude of the reference current, cell current information can be extracted easily. The memory state can be successfully detected by a simple sense amplifier circuit. The disclosed circuit structure also overcomes the bit line overcharge problem.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A sensing circuit for a non-volatile memory device, comprising:
    a bias generating circuit, comprising:
    a driving circuit, biased by a reference current; and
    an operational amplifier, for receiving a reference voltage at a non-inverting input terminal of the operational amplifier, and generating an output voltage at an inverting input terminal of the operational amplifier via a negative feedback path comprising the driving circuit; and
    a first sense amplifier, comprising:
    a first replica circuit, coupled to the bias generating circuit, for replicating the output voltage to a first bit line coupled to a first memory cell; and
    a first current sensing circuit, coupled to the first replica circuit, for sensing a first current difference between a scaled version of the reference current and a first cell current of the first memory cell to determine a first memory state of the first memory cell.

2. The sensing circuit according to claim 1, further comprising:
- a second sense amplifier, comprising:
- a second replica circuit, coupled to the bias generating circuit, for replicating the output voltage to a second bit line coupled to a second memory cell; and
- a second current sensing circuit, coupled to the second replica circuit, for sensing a second current difference between a scaled version of the reference current and a second cell current of the second memory cell to determine a second memory state of the second memory cell.

3. The sensing circuit according to claim 1, wherein the first replica circuit comprises a first current mirror configured to mirror the reference current.

4. The sensing circuit according to claim 1, wherein the first current sensing circuit comprises:
- a sensing transistor, configured to detect the first cell current;
- a sensing current mirror, configured to mirror a current flowing through the sensing transistor;
- a scaled reference current mirror, configured to mirror the scaled version of the reference current; and
- a current comparator, configured to compare a current of the sensing current mirror and a current of the scaled reference current mirror to determine the first memory state of the first memory cell.

5. The sensing circuit according to claim 1, wherein the driving circuit comprises:
- a first PMOS transistor, having a source, a drain, and a gate coupled to the drain to provide a first bias voltage; and
- a first NMOS transistor, having a source coupled to the inverting input terminal of the operational amplifier, a drain coupled to the drain of the first PMOS transistor, and a gate coupled to an output terminal of the operational amplifier to provide a second bias voltage.

6. The sensing circuit according to claim 5, wherein the first replica circuit comprises:
- a second PMOS transistor, having a source, a drain, and a gate coupled to the first bias voltage; and
- a second NMOS transistor, having a source coupled to the first bit line, a drain coupled to the drain of the second PMOS transistor, and a gate coupled to the second bias voltage.

7. The sensing circuit according to claim 6, wherein the first PMOS transistor and the second PMOS transistor are equal in size, and the first NMOS transistor and the second NMOS transistor are equal in size.

8. The sensing circuit according to claim 6, wherein the first current sensing circuit comprises:
- a third NMOS transistor, having a source, a drain coupled to the first bit line, and a gate coupled to the drain of the second NMOS transistor;
- a third PMOS transistor, having a source, a drain, and a gate coupled to the first bias voltage;
- a fourth NMOS transistor, having a source, a drain coupled to the drain of the third PMOS transistor, and a gate coupled to the gate of the third NMOS transistor;
- a fourth PMOS transistor, having a source, a drain coupled to the source of the second PMOS transistor, and a gate coupled to an enable signal; and
- a fifth NMOS transistor, having a source, a drain coupled to the gate of the fourth NMOS transistor, and a gate coupled to the enable signal.

9. The sensing circuit according to claim 8, wherein the first sense amplifier is configured to enable or disable the current sensing operation in response to the enable signal.

10. The sensing circuit according to claim 9, wherein the reference current is two times of a current of a reference memory cell, and a size of the first PMOS transistor is two times of a size of the third PMOS transistor.

11. A sensing method for a non-volatile memory device, comprising:
- biasing a driving circuit by a reference current;
- receiving a reference voltage at a non-inverting input terminal of an operational amplifier;
- generating an output voltage at an inverting input terminal of the operational amplifier via a negative feedback path comprising the driving circuit;
- replicating the output voltage to a first bit line coupled to a first memory cell; and
- sensing a first current difference between a scaled version of the reference current and a first cell current of the first memory cell to determine a first memory state of the first memory cell.

12. The sensing method according to claim 11, further comprising:
- replicating the output voltage to a second bit line coupled to a second memory cell; and
- sensing a second current difference between a scaled version of the reference current and a second cell current of the second memory cell to determine a second memory state of the second memory cell.

13. The sensing method according to claim 11, wherein the step of replicating the output voltage to the first bit line comprises:
- enabling a first current mirror to mirror the reference current.

14. The sensing method according to claim 11, wherein the step of sensing the first current difference between the scaled version of the reference current and the first cell current of the first memory cell comprises:
- detecting the first cell current by a sensing transistor;
- enabling a sensing current mirror to mirror a current flowing through the sensing transistor;
- enabling a scaled reference current mirror to mirror the scaled version of the reference current; and
- comparing a current of the sensing current mirror and a current of the scaled reference current mirror to determine the first memory state of the first memory cell.

15. The sensing method according to claim 11, wherein the driving circuit comprises:
- a first PMOS transistor, having a source, a drain, and a gate coupled to the drain to provide a first bias voltage; and
- a first NMOS transistor, having a source coupled to the inverting input terminal of the operational amplifier, a drain coupled to the drain of the first PMOS transistor, and a gate coupled to an output terminal of the operational amplifier to provide a second bias voltage.

16. The sensing method according to claim 15, wherein the step of replicating the output voltage to the first bit line is performed by a first replica circuit, comprising:
- a second PMOS transistor, having a source, a drain, and a gate coupled to the first bias voltage; and
- a second NMOS transistor, having a source coupled to the first bit line, a drain coupled to the drain of the second PMOS transistor, and a gate coupled to the second bias voltage.

17. The sensing method according to claim 16, wherein the first PMOS transistor and the second PMOS transistor are equal in size, and the first NMOS transistor and the second NMOS transistor are equal in size.

18. The sensing method according to claim 16, wherein the step of sensing the first current difference is performed by a first current sensing circuit, comprising:
- a third NMOS transistor, having a source, a drain coupled to the first bit line, and a gate coupled to the drain of the second NMOS transistor;
- a third PMOS transistor, having a source, a drain, and a gate coupled to the first bias voltage;
- a fourth NMOS transistor, having a source, a drain coupled to the drain of the third PMOS transistor, and a gate coupled to the gate of the third NMOS transistor;
- a fourth PMOS transistor, having a source, a drain coupled to the source of the second PMOS transistor, and a gate coupled to an enable signal; and
- a fifth NMOS transistor, having a source, a drain coupled to the gate of the fourth NMOS transistor, and a gate coupled to the enable signal.

19. The sensing method according to claim 18, wherein the first sense amplifier is configured to enable or disable the current sensing operation in response to the enable signal.

20. The sensing method according to claim 19, wherein the reference current is two times of a current of a reference memory cell, and a size of the first PMOS transistor is two times of a size of the third PMOS transistor.

* * * * *